United States Patent
Oe et al.

(10) Patent No.: US 8,292,686 B2
(45) Date of Patent: Oct. 23, 2012

(54) METHOD AND APPARATUS FOR MANUFACTURING LIGHT SOURCE

(75) Inventors: Shinichi Oe, Chiyoda-ku (JP);
Kazutaka Ikeda, Chiyoda-ku (JP);
Akira Nakamura, Chiyoda-ku (JP);
Motoaki Tamaya, Chiyoda-ku (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 68 days.

(21) Appl. No.: 12/852,145

(22) Filed: Aug. 6, 2010

(65) Prior Publication Data

US 2011/0124259 A1 May 26, 2011

(30) Foreign Application Priority Data

Nov. 26, 2009 (JP) .................................. 2009-268680

(51) Int. Cl.
*H01J 9/42* (2006.01)

(52) U.S. Cl. ........................................... 445/63; 445/66

(58) Field of Classification Search ............... 445/63, 445/66; 156/349–351, 378
See application file for complete search history.

(56) References Cited

U.S. PATENT DOCUMENTS 6,122,307 A  9/2000 Koseki

FOREIGN PATENT DOCUMENTS

| JP | 1-180507 A | 7/1989 |
|---|---|---|
| JP | 05-243660 A | 9/1993 |
| JP | 10-303481 A | 11/1998 |
| JP | 2001-196684 A | 7/2001 |
| JP | 2004-109256 A | 4/2004 |
| JP | 2004-294594 A | 10/2004 |

OTHER PUBLICATIONS

Office Action (Notice of Reason(s) for Refusal) dated Feb. 7, 2012, issued in the corresponding Japanese Patent Application No. 2009-268680, and an English Translation thereof. (10 pages).

*Primary Examiner* — Anne Hines
(74) *Attorney, Agent, or Firm* — Buchanan Ingersoll & Rooney PC

(57) ABSTRACT

An apparatus for manufacturing a light source and a method therefor are provided that enables a high efficient light source to be manufactured even when an optical element whose characteristic significantly varies is used. After maintaining temperatures of a laser device and a wavelength conversion element at a temperature where an output of light emitted from each of the device and the element is equal to or greater than a predetermined rate of the maximum output, the laser device and the wavelength conversion element whose temperatures have been maintained are joined together so that the output of the light emitted from the wavelength conversion element is equal to or greater than a predetermined value.

6 Claims, 8 Drawing Sheets

FIG. 6

|   | Position shift mechanism 12 (condition above semiconductor laser 2) | Condition between semiconductor laser 2 and SHG1 | Temperature of moving stage 4 | Temperature of stationary stage 3 |
|---|---|---|---|---|
| A | Alignment process 1 | Stationary stage 3 | Air | T1 | T2 |
| B | Adhesive application process | Dispenser 1 | — | T1 | T2 |
| C | Alignment process 2 | Stationary stage 3 | Adhesive | T3 | T4 |

METHOD AND APPARATUS FOR MANUFACTURING LIGHT SOURCE

FIELD OF THE INVENTION

The present invention relates to methods and apparatuses for manufacturing a light source by joining a laser device, such as a semiconductor laser and/or a solid-state laser, to a wavelength conversion element for converting a wavelength of a laser beam to be emitted from the laser device into another.

BACKGROUND OF THE INVENTION

By causing a laser beam emitted from a laser device to enter a wavelength conversion element, the laser beam of a desired wavelength can be provided, while the efficiency of a light source is reduced if such optical elements are joined together out of their proper relative position. Thus, the two optical elements are joined together after the relative position of the two optical elements has been adjusted to focus the light beam from the laser device on the wavelength conversion element.

There generally exist two methods of adjusting the relative position of two optical elements: one is called passive alignment, in which the relative position is adjusted with reference to the outer appearances of the optical elements or a target mark, or the relative position is mechanically determined by an abutment fit, and the other is called active alignment in which emission light from a laser device is caused to enter a wavelength conversion element, an amount of the outgoing laser light through the wavelength conversion element in operation is measured with a power meter or like means measures an amount of emitted light from the laser device with the wavelength conversion element in operation, and the position of the laser device or the wavelength conversion element is adjusted to move it three dimensionally so that the measured amount of the outgoing light becomes a maximum.

Of these, a suitable adjustment method is selectively used according to the circumstances, based on conditions such as functional accuracy in optical elements that configure a light source, a light output power to be required by the light source, and the like. An example of the active alignment includes a technique in which optical axes of the two optical elements are aligned so that the maximum amount of light is achieved by measuring an amount of the outgoing light that enters a first optical element from a second optical element and propagates within the second optical element to be caused to emit from the optical element (refer to Japanese Unexamined Patent Application Publication No. H01-180507, which hereinafter called Patent Document 1; and Japanese Unexamined Patent Application Publication No. 2004-109256, which is hereinafter called Patent Document 2).

Further, because the difference in temperatures between respective stages retaining the two optical elements causes different amount of variation in expansion/contraction of the stages, resulting in the retained optical elements being joined together with their misaligned positions, there is another example in which the two optical elements are joined together after the two stages have been heated and maintained at the same temperature (refer to Japanese Unexamined Patent Application Publication No. 2004-294594, which is hereinafter called Patent Document 3).

However, a problem is created in that when the temperatures of the optical elements are not controlled, as is the case with Patent Document 1 and Patent Document 2, or the stages retaining the two optical elements are heated at the same temperature, as is the case with Patent Document 3, high efficient light source cannot be provided because the optical elements is likely to significantly vary its characteristics by temperature and therefore its positions cannot properly be adjusted.

SUMMARY OF THE INVENTION

The present invention is directed to provide a method of and an apparatus for manufacturing a light source that enables a high efficient light source to be manufactured even if optical elements are used whose characteristics greatly vary depending on the temperature.

A method of and apparatus for manufacturing a light source according to the present invention is such that after a temperature of a wavelength conversion element is maintained at a temperature that allows an output of light emitted from the wavelength conversion element to reaches or exceeds a predetermined rate of the maximum output, the laser device and the wavelength conversion element are joined so that an output of light emitted from the wavelength conversion element is equal to or greater than a predetermined value.

The present invention provides a high efficient light source because the laser device and the wavelength conversion element can be joined, with them maintained at their respective temperatures that cause the light outputs to increase. These and other objects of the present invention will be better understood by reading the following detailed description in combination with the attached drawings of a preferred embodiment of the invention.

BRIEF DESCRIPTION OF THE DRAWINGS

FIG. 6 is a table illustrating an adjustment process, and apparatus statuses in its individual processes, in the light source manufacture apparatus according to Embodiment 1 of the present invention;

DESCRIPTION OF THE PREFERRED EMBODIMENTS

Embodiment 1

Figure 1:
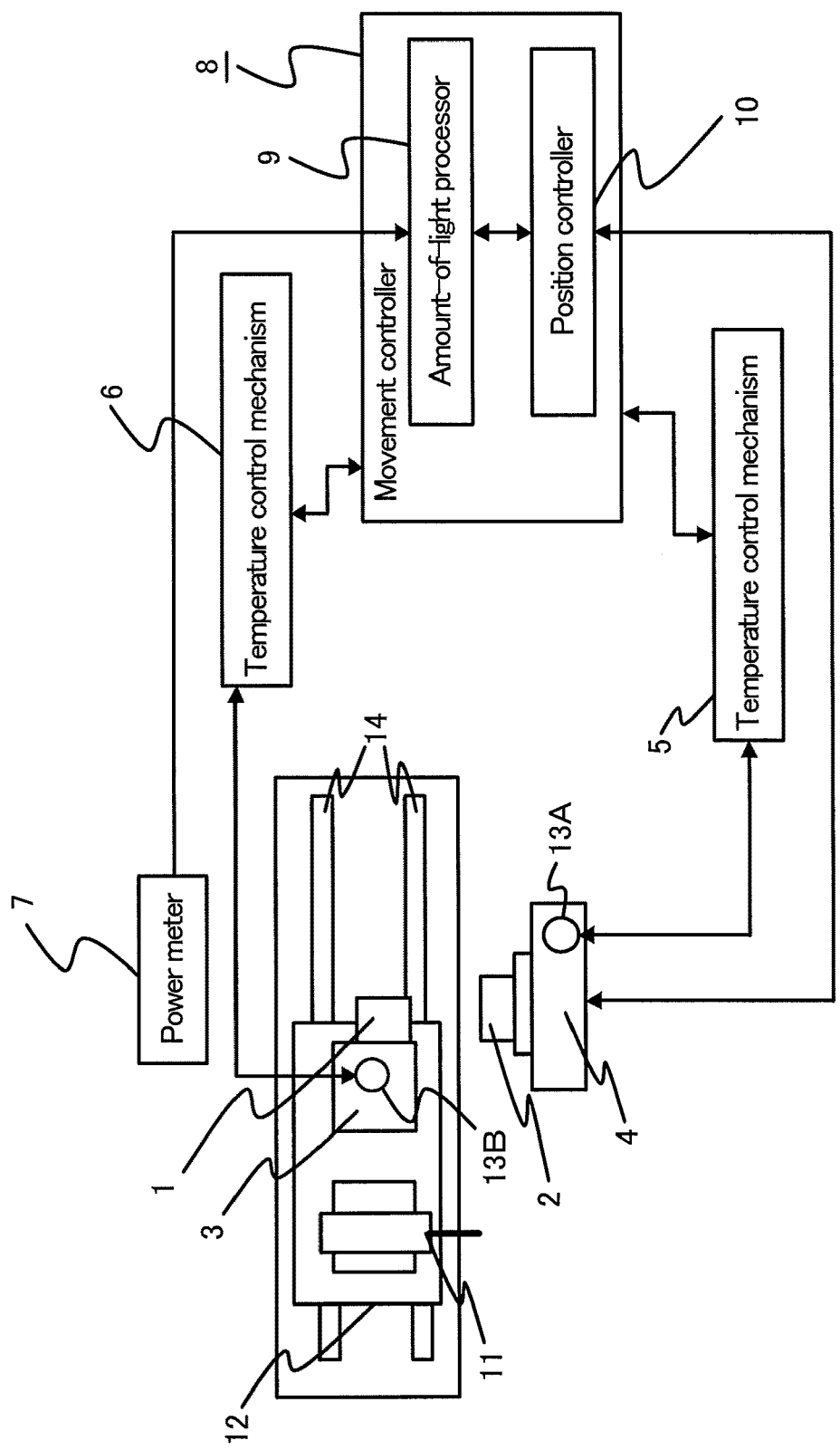
FIG. 1 is a schematic side view illustrating a light source manufacture apparatus according to Embodiment 1 of the present invention.

FIG. 1 is a schematic side view illustrating a light source manufacture apparatus according to Embodiment 1 of the present invention. The light source manufacture apparatus shown in FIG. 1 aligns an optical axis of the laser device to that of a second harmonic generation element (wavelength conversion element) and then join them together to achieve optical coupling. Here, the optical coupling refers to a condition in which light emitted from the laser device is caused to enter without any energy loss the second harmonic generation element. A light source manufactured by the light source manufacture apparatus shown in FIG. 1 is used for, e.g., a light source for use in a projection television set.

Referring to FIG. 1, the light source manufacture apparatus includes a stationary stage 3 that retains the second harmonic generation element (hereinafter called SHG element 1), a moving stage 4 that retains a laser device 2, a temperature controller 5 that controls a temperature of the moving stage 4 by controlling a temperature regulation mechanism 13A, a temperature controller 6 that controls a temperature of the stationary stage 3 by controlling a temperature regulation mechanism 13B, a power meter 7 that measures an amount of light emitted from the SHG element 1, a movement controller 8 that controls the movements of the temperature controllers 5 and 6 and the moving stage 4 based on signals from the power meter, a dispenser 11 that applies adhesive to a surface of the laser device 2, and a position change mechanism 12 that moves in left-right directions in FIG. 1 along a rail 14 so that a light entry surface of the SHG element 1 or the dispenser 11 comes in a position located opposite a light exit surface of the laser device 2.

The stationary stage 3 serves as a second retainer, which is made of a high thermal conductive metal material, e.g., copper or aluminum, retains or sucks the SHG element 1 on or to its side. The moving stage 4 serving as the first retainer, which is configured to be movable with respect to the stationary stage fixed to a predetermined place, is made of a high thermal conductive metal material such as copper or aluminum, and retains or sucks the laser device 2 on or to its upper surface.

The temperature controller 5 controls a temperature of the moving stage 4 by controlling a temperature regulation mechanism 13A that is made up of a Peltier device, a cartridge heater and the like. More specifically, the temperature controller 5 detects temperature of the moving stage 4 via the temperature regulation mechanism 13A and then maintains the temperature of the moving stage 4 at a predetermined temperature through a feedback control loop. The temperature controller 6 controls a temperature of the stationary stage 3 by controlling the temperature regulation mechanism 13B that is made up of the Peltier device, the cartridge heater and the like. More specifically, the temperature controller 6 detects the temperature of the stationary stage 3 via the temperature regulation mechanism 13B and then maintains the temperature of the stationary stage 3 at a predetermined temperature through a feedback control loop. Characteristics of the SHG element 1 and the laser device 2 vary according to the temperature variation, which in turn causes variations of the wavelength, mode and intensity distribution, etc. of light emitted from such optical elements. Thus, the temperature mechanisms 13A and 13B, controlled by the temperature controllers 5 and 6, adjust the temperatures of the stationary stage 3 and the moving stage 4, respectively, to those such that the characteristics of the SHG element 1 and the laser device 2 become favorable. While the temperature of the stationary stage 3 is actually different from that of the SHG element 1 and the temperature of the moving stage 4 from that of the laser device 2, their respective temperature differences are predetermined by experiments and simulations, to adjust the temperatures of the respective stages so that the respective temperatures of the elements reach a desired temperature. In this way, by adjusting the temperatures of the stationary stage 3 and the moving stage 4, the temperature controllers 5 and 6 adjust the temperatures of the SHG element 1 and the laser device 2, respectively. Here, the temperature controller 5 and the temperature regulation mechanism 13A constitute the first temperature retainer, while the temperature controller 6 and the temperature regulation mechanism 13B constitute the second temperature retainer.

The power meter serves as the amount-of-light detector, which is disposed above a light exit surface of the SHG element 1, and measures an amount of light to be emitted from the laser device 2, through an optical waveguide of the SHG element 1, and then emitted from the light exit surface. The movement controller 8 includes an amount-of-light processor 9 that receives information on the amount of light from the power meter 7, and a position controller 10 that relatively moves the moving stage 4 retaining the laser device 2 with respect to the stationary stage 3, based upon information on the amount-of-light information delivered from the amount-of-light processor 9. The movement controller 8 also controls the temperature controllers 5 and 6.

The dispenser 11 applies an appropriate amount of adhesive, serving as a joining substance, to a portion where the SHG element 1 and the laser device 2 is joined together. The dispenser 11 is a device that applies between the laser device 2 and the SHG element 1 a joining substance for joining the device 2 and the element 1 together. The dispenser 11 and the stationary stage 3 are placed together in the position change mechanism 12. The position change mechanism 12, which engages with the rail 14, moves in the left-right directions shown in FIG. 1. The position change mechanism 12 moves so that the stationary stage 3 comes in a position located above the laser device 2 in the adjustment process of determining positions of the laser device 2 and the SHG element 1, and also moves so that the dispenser 11 comes in a position located above the laser device 2 in the adhering process of properly applying adhesive to the joining portion of the laser device 2 and the SHG element 1.

Figure 2:
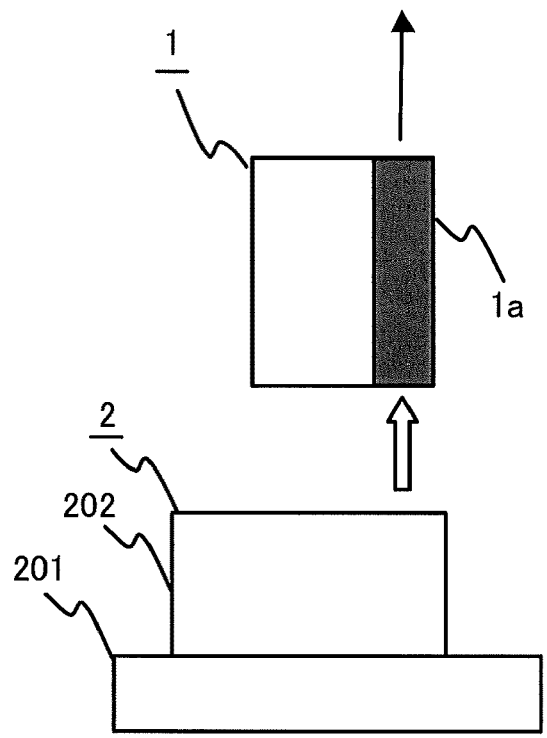
FIG. 2 is schematic diagram illustrating a positional relationship between a laser device and a wavelength conversion element retained by the light source manufacture apparatus according to Embodiment 1 of the present invention.

FIG. 2 is schematic diagram illustrating a positional relationship between a laser device 2 and a SHG element 1 with the position change mechanism 12 moved so that the stationary stage 3 comes in a position located above the laser device 2. The laser device 2 is connected to an energizing mechanism, not shown. Energization of the laser device 2 by the energizing mechanism causes the laser device 2 to emit light having a wavelength of λ (lamda) and an amount of light of P1. Here, the laser device 2 is configured with an LD module 201 that emits pump light, and/or with a solid-state laser 202 that receives the pump light from the LD module 201, to generate a fundamental wave (laser light) of a specific wavelength, and resonates and amplifies the generated fundamental wave (laser light) to emit it. The light emitted from the laser device 2 enters an optical waveguide 1a formed in the SHG element 1, and after resonated and amplified within the optical waveguide 1a, the light turns out to be a second harmonic wave having one-half the wavelength of the incident light and having an amount of light of P2.

For example, when a light source manufactured using the light source manufacture apparatus according to the present embodiment is employed for a light source for use in a projection television set, the light emitted from the laser device 2 is caused to enter the SHG element 1 and the second harmonic wave having one-half the wavelength of the incident light, whereby high output green and blue light sources can be provided. In the present embodiment, a green light source is achieved by producing, using the SHG element 1, light having a wavelength of 532 nm from light of a 1064 nm wavelength emitted from the laser device 2, as will be described below.

While the dispenser 11 applies the adhesive to a surface located opposite the SHG element 1 of the laser device 2, the adhesive will not be applied to its surface portion, located opposite an incident surface, of the optical wave guide 1a in order to eliminate an effect of the adhesive on the light. When the laser device 2 and the SHG element 1 are joined together, the light entry surface of the optical waveguide 1a and the light exit surface of the laser device 2 face each other with a gap between them corresponding to the thickness of the adhesive.

Figure 3A:
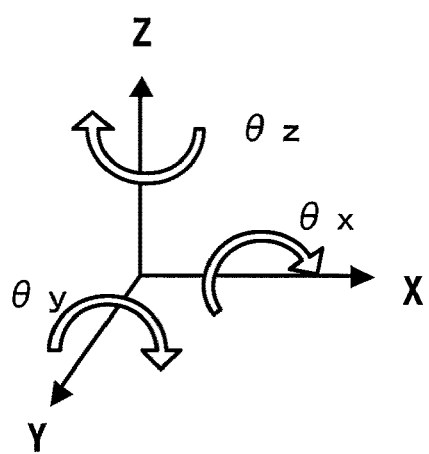
FIG. 3A is a view illustrating X, Y and Z coordinates and movement directions of a moving stage in the light source manufacture apparatus according to Embodiment 1 of the present invention.
Figure 3B:
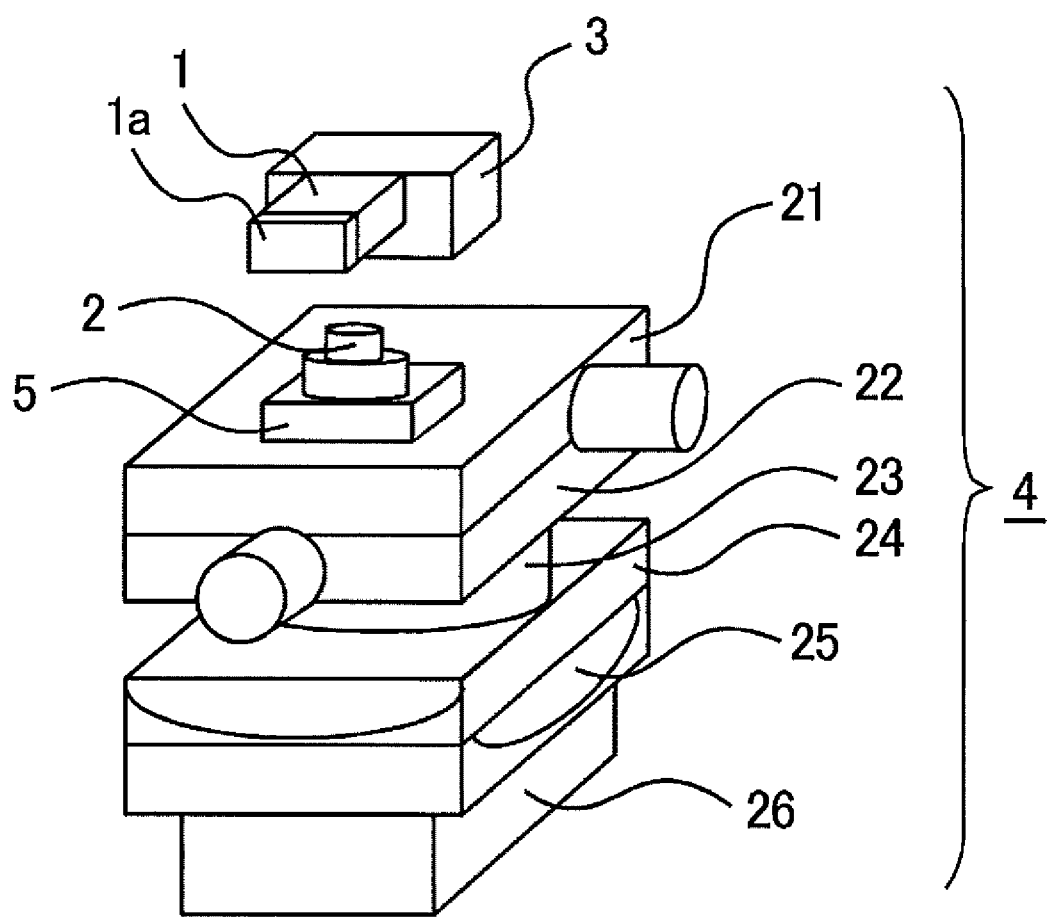
FIG. 3B is a perspective schematic diagram illustrating axes configuration of the moving stage in the light source manufacture apparatus according to Embodiment 1 of the present invention.

FIG. 3A is a view illustrating X, Y and Z coordinates and movement directions of the moving stage 4, while FIG. 3B is a perspective schematic diagram illustrating the axial configurations of the moving stage 4. Components that are the same as or corresponding to the components in FIG. 1 bear the same numerals, and their description is not provided herein. Referring to FIG. 3B, the moving stage 4 is configured with an X axis stage 21, a Y axis stage 22, a θz stage 23, a θy stage 24, a θx stage 25 and a Z axis stage 26. Each of the stages constituting the moving stage 4 corresponds to each of the movement directions shown in FIG. 3A (X, Y and Z directions, and θx, θy and θz directions). For example, turning an adjustment knob provided on the side portion of the X axis stage 21 causes the X axis stage 21 to move in the X direction shown in FIG. 3A, so that the laser device 2 moves in the X direction, accordingly. Upon movement of the θz stage 23, the laser device 2 rotates about the Z axis shown in FIG. 3A (i.e., rotates in the θz direction). In this way, the moving stage 4 enables the laser device 2 to move in each of the movement directions (X, Y and Z directions, and θx, θy and θz directions).

Figure 4:
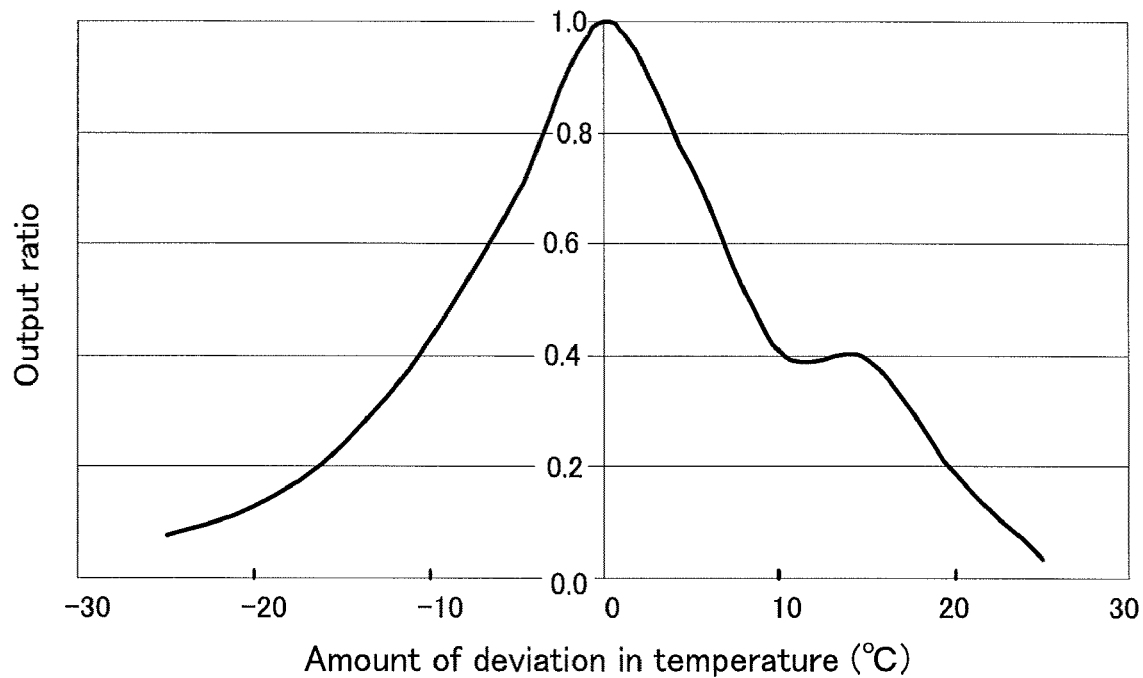
FIG. 4 is a graph illustrating a light output variation due to a temperature variation of a laser device for use in a light source to be manufactured according to the present invention.

FIG. 4 is a graph illustrating a light output variation due to a temperature variation of the laser device 2. Referring to FIG. 4, the horizontal axis represents a temperature deviation amount (degree C.) of the laser device 2 from an optimum temperature that maximizes the output, while the vertical axis represents an output ratio of the laser device 2 to the output at the optimum temperature. Here, the output ratio at the deviation amount (degree C.) of zero (at the optimum temperature) is one.

For example, if the laser device 2 including the LD module 201 is applied to the light source for use in the projection television set, then the laser device is required to emit light at a high output power and therefore, the LD module 201 self-generates heat. Thus, unless the heat generated from the LD module 201 is removed, the temperature of device elements in the module 201 rises, thereby causing the characteristic of light emission to vary. For example, if the element temperature varies one degree C., then the output of light that enters the SHG element from the laser device 2 decreases by about 3% (about 10% decreases by 5 degrees C. deviation) in comparison to the case where the temperature is adjusted to a proper one, as shown in FIG. 4.

Thus, when the optical axis alignment is made at a temperature where the characteristic value varies abruptly, there is a likelihood that a longer time for the optical axis alignment is required because of greater variation in measured values with the amount-of-light measuring device, or that the optical axis alignment is made under a relatively low amount of the light. It is therefore preferable that in order to make correct alignments in the alignment process, the temperature of the laser device 2 is adjusted to the optimum temperature.

Figure 5:
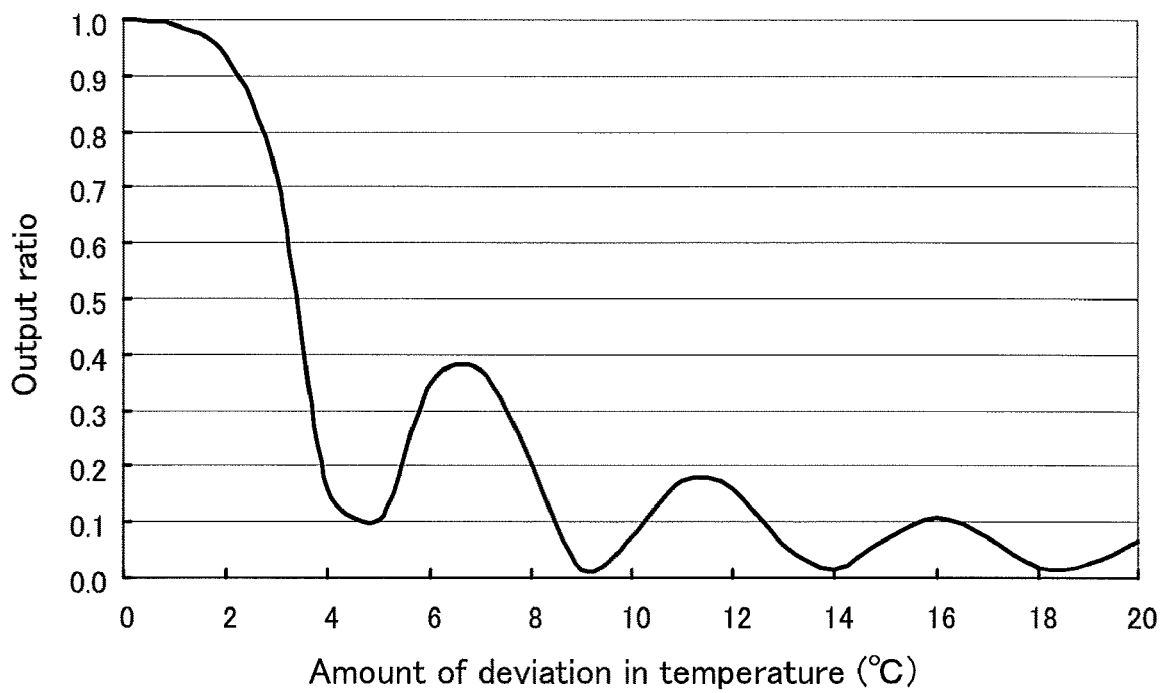
FIG. 5 is a graph illustrating a light output variation due to a temperature variation of a wavelength conversion element for use in a light source to be manufactured according to the present invention.

FIG. 5 is a graph illustrating an output variation due to a temperature variation of the SHG element 1. Referring to FIG. 5, the horizontal axis represents an amount of deviation in temperature (degrees C.) of the SHG element from its optimum temperature that maximizes the output, while the vertical axis represents an output ratio of the SHG element 1 to the output at the optimum temperature. Here, the output ratio at the amount of the deviation (degrees C.) of zero (at the optimum temperature) is one.

If the temperature of the SHG element 1 is deviated by two degrees C. from the optimum temperature, for example, then the output of the second harmonic wave having one-half the wavelength of light emitted from the laser device 2 is reduced by about 7% (about 30% reduction for a deviation amount by three degrees C.). For example, when adjustments are made at a temperature that is deviated significantly from the optimum temperature, such as the temperature where the intensity is at the second highest peak (a deviation of 6.5 degrees C.), there is the likelihood that the desired output of light cannot be achieved and therefore the optical axis adjustment cannot be made at a proper adjustment position. Thus, preferably, the temperature of the SHG element 1 is adjusted to the optimum temperature.

Next, their operation will be described. FIG. 6 is a table illustrating an adjustment process and apparatus statuses in its individual processes, according to Embodiment 1 of the present invention. Referring to FIG. 6, the adjustment process includes (a) alignment process-1, (b) adhesive application process, and (c) alignment process-2.

In the alignment process-1, the position change mechanism 12 is moved so that the stationary stage 3 comes in a position located above the laser device 2. Subsequently, the moving stage 4 is moved by a predetermined distance for each of the moving axes (X, Y and Z directions, and θx, θy and θz directions), to detect the relative position of the laser device 2 and the SHG element 1 where the amount of light becomes a maximum. Here, in the alignment process-1, because it is placed before the adhesive is applied, air occupies the space between the laser device 2 and the SHG element 1, and therefore the temperature of the moving stage 4 is set to a temperature (T1) where the 1064 nm wavelength light is emitted most intensely, and the temperature of the stationary stage 3 is set to a temperature (T2) where the second harmonic wave having one-half the wavelength of the incident light is most efficiently generated. This allows detection of the relative position of the laser device 2 and the SHG element 1, where the amount of light becomes a maximum when the air occupies the space between the laser device 2 and the SHG element 1. Here, T1 represents a temperature of the moving stage 4 (a first target temperature) determined in advance, by experiments and simulations, such that the laser device 2 most intensely emits the 1064 nm wavelength light at the temperature when the air occupies the space between the laser device 2 and the SHG element 1. Furthermore, T2 represents a temperature of the stationary stage 3 (a second target temperature) determined in advance, by experiments and simulations, such that the SHG element 1 most efficiently generates the second harmonic wave having one-half the wavelength of the incident light at the temperature when the air occupies the space between the laser device 2 and the SHG element 1.

Upon detection in the alignment process-1 of the relative position of the laser device 2 and the SHG element 1, that maximizes the amount of light, processing will move to the next adhesive application process. In the adhesive application process, the position change mechanism 12 is first moved so that the dispenser 11 comes in a position located above the laser device 2. Upon movement of the position change mechanism 12, a proper amount of the adhesive is applied to the joining portion of the laser device 2 and the SHG element 1 using the dispenser 11.

After the adhesive is applied, processing moves to the alignment process-2. In the alignment process-2, the position change mechanism 12 is moved so that the stationary stage 3 comes in a position located above the laser device 2. Then, the SHG element 1 is first moved to a relative position of the moving stage 4 and the stationary stage 3, which position has been determined to maximizes the amount of light before the adhesive application.

In the alignment process-1, the air occupies all the space between the laser device 2 and the SHG element 1, while in the alignment process-2, the adhesive partially occupies the space, and therefore, heat transfers between the laser device 2 and the SHG element 1 via the adhesive, thereby varying the element or device temperature. Because the temperature relationship between the laser device 2 and the SHG element 1 is thus different from that in the alignment process-1, the relative position maximizing the amount of light determined after the adhesive application become different form that determined before the adhesive application, if the temperatures of the laser device 2 and the SHG element 1 are not properly controlled. It is now known that when adjustment processes are actually executed at the constant temperatures for the respective stages maintained before and after the adhesive application, i.e., with the temperature of each stage in the alignment process-2 being the same as that in the alignment process-1, the amount of light after the adhesive application decreases by about 10%.

To this end, the temperatures of the stationary stage 3 and the moving stage 4 in the alignment process-2 are set to be different values from those in the alignment process-1. In this case, the temperature of the moving stage 4 is adjusted, using the temperature controller 5, to a temperature (T3) where the 1064 nm wavelength light is emitted most intensely, and the temperature of the stationary stage 3 is also adjusted to a temperature where the second harmonic wave having one-half the wavelength of the incident light is generated most effectively. Here, T3 represents a temperature of the moving stage 4 (the first target temperature) determined in advance, by experiments and simulations, such that the laser device 2 most intensely emits the 1064 nm wavelength light at the temperatures when the adhesive partially occupies the space between the laser device 2 and the SHG element 1. Furthermore, T4 represents a temperature of the stationary stage 3 (a second target temperature) determined in advance, by experiments and simulations, such that the SHG element 1 most effectively generates the second harmonic wave having one-half the wavelength of the incident light at the temperatures when the adhesive partially occupy the space between the laser device 2 and the SHG element 1.

After adjustment of the temperatures of the stationary stage 3 and the moving stage 4, the moving stage is caused to finely move in the six directions—X, Y, Z, θx, θy, and θz directions—from the relative position that has been determined before the adhesive application and maximizes the amount of light. A relative position of the laser device 2 and the SHG element 1 is determined where the amount of light of the power meter 7 reaches or exceeds a given amount by fine movement, and the element 1 and the device 2 are adhesively fixed together at this relative position. The temperature control of the laser device 2 and the SHG element 1 continues until such optical elements are adhesively fixed together; after their fixation, the device 2 and element 1, fixed together, are removed from the stationary stage 3 and the moving stage 4, respectively. Since some adhesive starts hardening in about 120 seconds after having been applied, position adjustments of optical elements in the alignment process-2 needs to be made within such a period when using such an adhesive. By keeping the laser device 2 energized until the two optical elements are adhesively fixed together, an influence of temperature variation due to deenergization can be eliminated.

The reason that the alignment process-1 and the alignment process-2 are separately executed is to make correct optical axis alignments even if the amount of heat transfer between the optical elements varies before and after applying the adhesive. Furthermore, because the adhesive application process is conducted after the alignment process-1, the adhesive application can be made after confirming a proper output of each of the elements in the alignment process-1, which eliminates a problem in the alignment process such that because of one part being defective item, the other, albeit non-defective item, cannot be utilized, either. Further, because the adhesive application process is conducted after roughly determining the positions in the alignment process-1, the problem associated with the adhesive squeezing out from between the optical elements and flowing toward the surface of the optical waveguide during the position adjustment process, can also be eliminated. Moreover, because the time required for the optical axis alignment in the alignment process-2 can be made shorter than that in the alignment process-1, the problem associated with adhesive hardening due to a prolonged alignment time can also be resolved.

Figure 7:
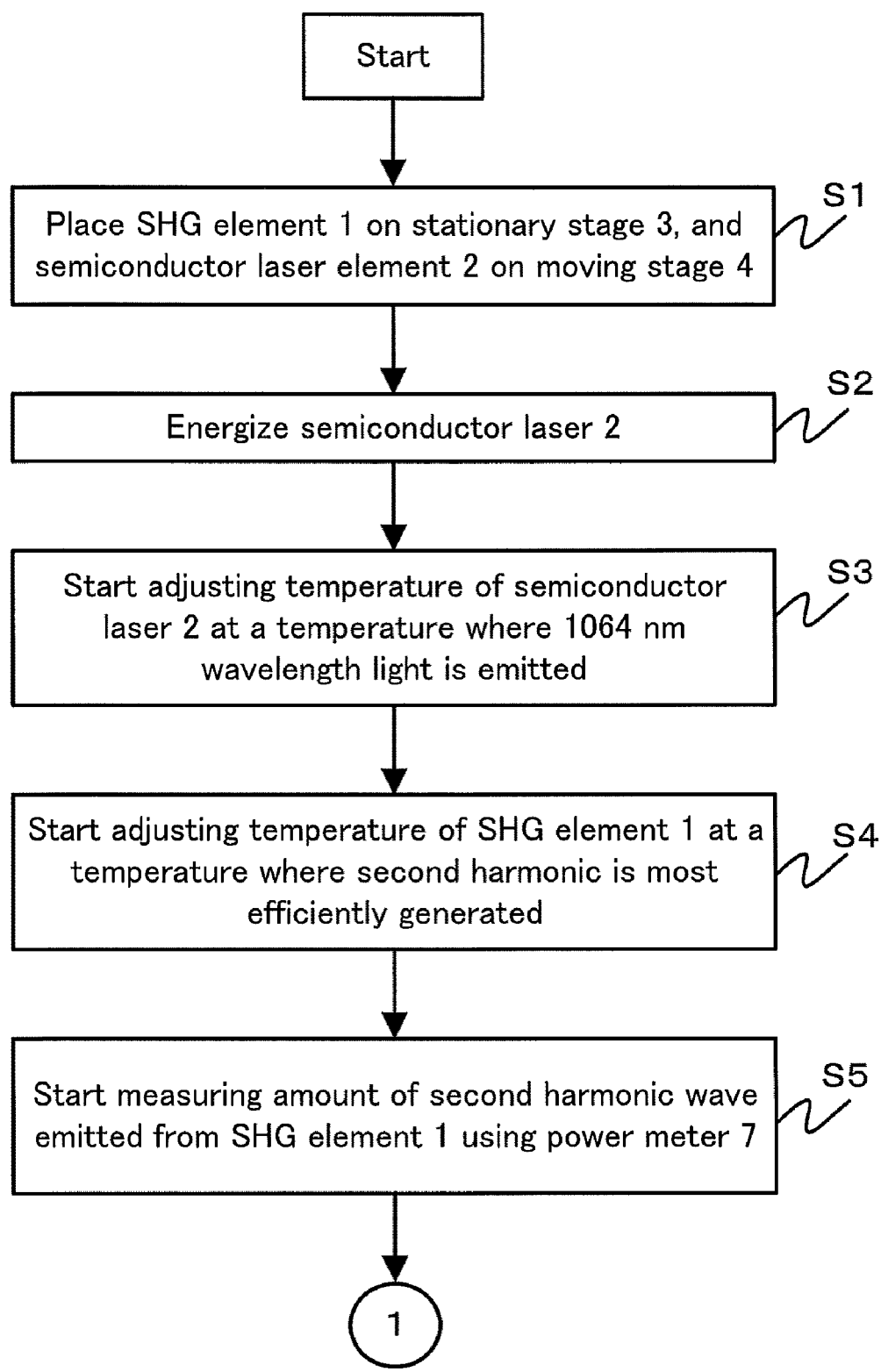
FIG. 7 is a flow chart illustrating details of pre-processing steps in an alignment process according to Embodiment 1 of the present invention.
Figure 8:
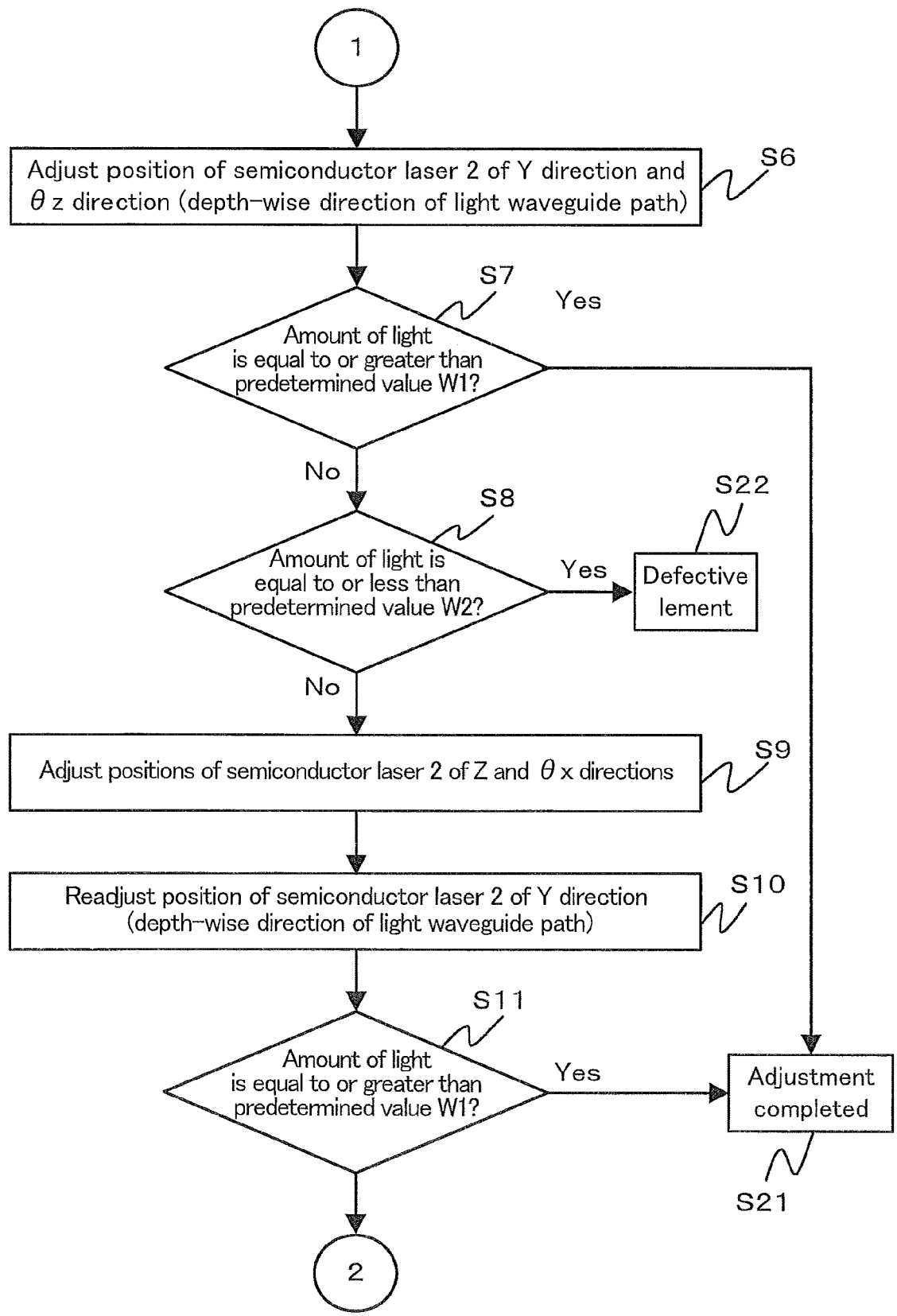
FIG. 8 is a flow chart illustrating details of processing steps for adjusting positions in Y, Z, θx and θz directions in the alignment process according to Embodiment 1 of the present invention.
Figure 9:
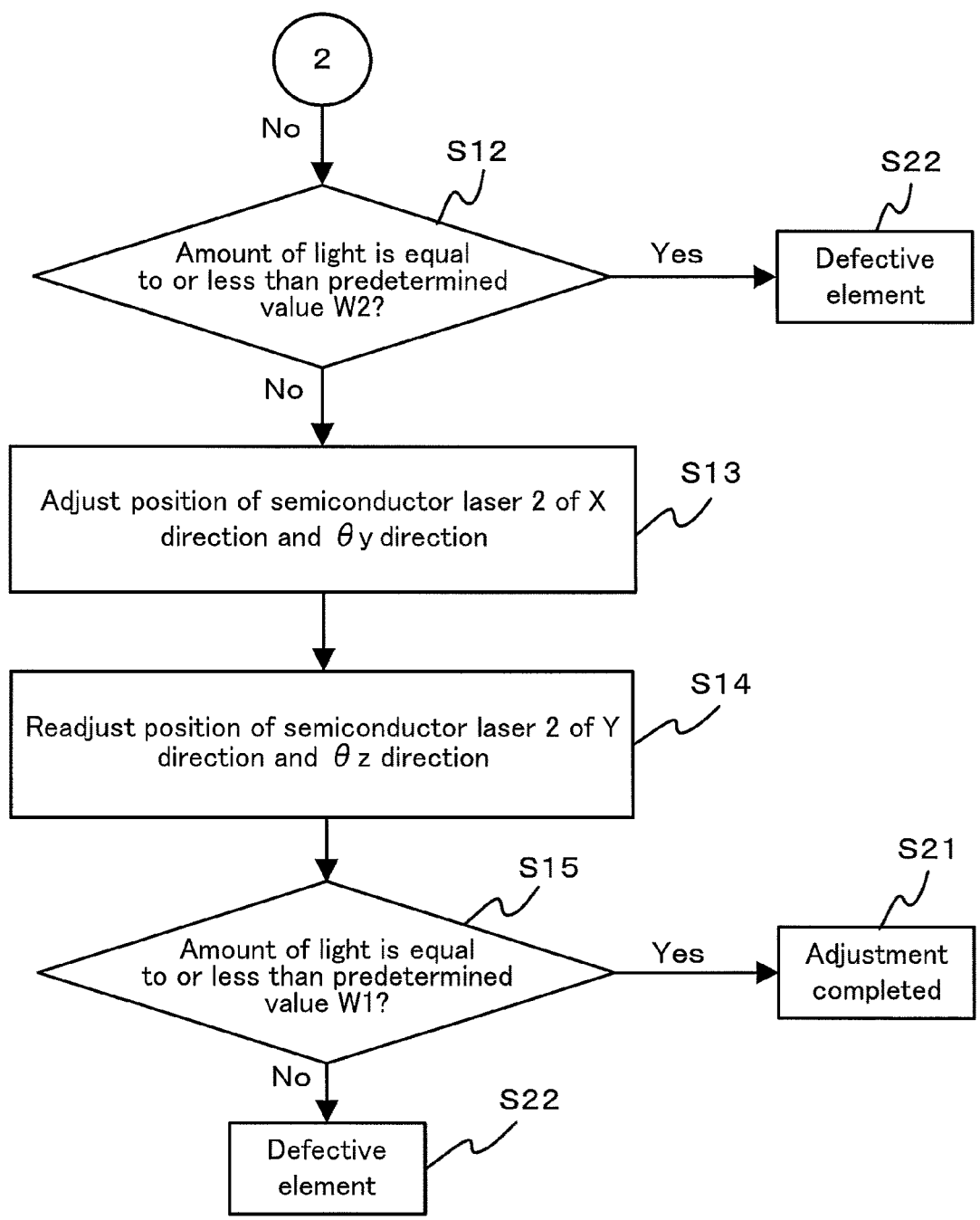
FIG. 9 is a flow chart illustrating details of processing steps for adjusting positions in X, Y and Ay directions in the alignment process according to Embodiment 1 of the present invention.

Next, the alignment process-1 (A in FIG. 6) will be described in more detail. FIG. 7 is a flow chart illustrating details of pre-processing steps in the alignment process-1, FIG. 8 is a flow chart illustrating details of processing steps of adjusting the positions in the Y, Z, θx and θz directions in the alignment process-1, and FIG. 9 is a flow chart illustrating details of processing steps of adjusting the positions in the X, Y and θy directions in the alignment process-1. A circled 1 in FIG. 7 corresponds to a circled 1 in FIG. 8, and a circled 2 in FIG. 8 to a circled 2 in FIG. 9; that is, FIGS. 7 through 9 constitute one flow chart.

Referring to FIG. 7, the SHG element is first disposed on the stationary stage 3 and the laser device 2 on the moving stage 4 using hands or a carriage mechanism, not shown (S1). Next, the energizing circuit energizes the laser device 2 (S2). The temperature adjustment of the moving stage 4 is initiated using the temperature controller (S3). The temperature adjustment is made in a way such that the temperature of the laser device 2 reaches a temperature (e.g., 40 degrees C.) where the 1064 nm wavelength light is emitted most intensely from the laser device 2. The temperature adjustment of the moving stage 4 continues until the SHG element 1 and the laser device 2 are adhesively fixed together. The temperature adjustment of the stationary stage 3 is initiated using the temperature regulation mechanism 6 (S4). The temperature adjustment is made in a way such that the temperature of the SHG element 1 reaches a temperature (e.g., 70 degrees C.) where the laser device 2 most efficiently emits the second harmonic wave having one-half the wavelength of the incident light. The temperature control of the stationary stage 3 continues until the SHG element 1 and the laser device 2 are adhesively fixed together. With the temperatures of the laser device 2 and the SHG element 1 adjusted to a proper temperature, the power meter 7 starts measuring the amount of light of the second harmonic wave emitted from the SHG element 1 (S5). The measurement using the power meter 7 continues until the alignment process is completed.

Next, the position controller 10 moves the moving stage 4 based upon information on the amount of light from the power meter 7. This movement can cause the laser device retained by the moving stage 4 to finely move in the six axis directions—X, Y, Z, θx, θy, and θz directions. Referring to FIG. 8, the position controller 10 first adjusts the Y direction and the θz direction (light waveguide path thick-wise direction) so that the light emitted from the laser device 2 sufficiently enters the optical waveguide 1a of the SHG element 1 (S6). The adjustments in the Y and the θz directions are made by causing the moving stage 4 to move in the Y and the θz directions by a predetermined range and to come in a position, within the movement range, where the amount of light reaches a maximum. As a result, if the amount of light measured by the power meter 7 reaches or exceeds the predetermined value W1 ("Yes" for S7), then the adjustment is completed for the sufficient amount of light being produced (S21), and the movement controller 8 records the relative position of the laser device 2 and the SHG element 2. If the amount of light to be measured using the power meter 7 is smaller than the predetermined value W2 ("No" in S7), then whether the amount of light to be measured with the power meter 7 is equal to or greater than the predetermined value W4 is subsequently determined. If the amount of light measured therewith is equal to or smaller than the predetermined value W2 (Yes in S8), then the adjustment process is completed for any one of the elements being defective (S22). Here, the predetermined value W1 is determined so that the amount of light to be emitted from the SHG element 1 is equal to or greater than the amount of light required by the design of the light source. The predetermined value W2 is set to a given proportion of the maximum amount of light (e.g., 50%). The ratio is determined based on experimentally assessed results.

When the amount of light measured using the power meter 7 is greater than the predetermined value W2 ("No" for S8), the adjustments in the Z and the θx directions are made in order to more effectively resonate the light within the optical waveguide 1a of the SHG element 1 (S9). The adjustments in the Z and the θx directions are made by causing the moving stage 4 to move in the Z and the θx directions by a predetermined range and to come in a position, within the predetermined range, where the amount of light reaches a maximum. Since adjusting the positions in the Y and θx directions are likely to cause the adjusted position in the Y and θz directions to be changed, the positions are readjusted in the Y and the θz directions (S10). The reason that the positions in the Y and θz directions are readjusted is that an effect of the change in the Y and θz directions on the output of light is greater than that in the rest of the directions. As a result of readjustments in the Y and θz directions, if the amount of light measured using the power meter 7 reaches or exceeds the predetermined value W1 ("Yes" in S7), then the adjustment is completed for the sufficient amount of light being produced (S21), and the movement controller 8 records the relative position of the SHG element 1 and the laser device 2. If the amount of light measured using the power meter 7 is smaller than the predetermined value W2 ("No" in S11), then whether the amount of light to be measured using the power meter 7 is equal to or smaller than the predetermined value W4 is subsequently determined. If the amount of light measured therewith is equal to or smaller than the predetermined value W2 ("Yes" in S11), then the adjustment process is completed for any one of the elements being defective (S22).

Referring to FIG. 9, when the amount of light measured with the power meter 7 is greater than the predetermined value W2 ("No" for S11), the adjustments in the X and θy directions are made (S13). The adjustments in the Y and the θy directions are made by causing the moving stage 4 to move in the X and the θx directions by a predetermined range and to come in a position, within the predetermined range, where the amount of light reaches a maximum. Since adjusting the positions in the Y and θy directions are likely to cause the adjusted position in the Y and θz directions to be changed, the positions in the Y and the θz directions are readjusted (S14). As a result of readjustments in the Y and θz directions, if the amount of light measured using the power meter 7 reaches or exceeds the predetermined value W1 ("Yes" in S15), then the adjustment is completed for the sufficient amount of light being produced (S21), and the movement controller 8 records the relative position of the SHG element 1 and the laser device 2. If the amount of light measured using the power meter 7 is smaller than the predetermined value W2 ("No" in S15), then the adjustment process is completed for any one of the elements being defective (S22).

In FIGS. 7 through 9, if the amount of light measured with the power meter 7 reaches or exceeds the predetermined value W1, then the adjustment is completed for the sufficient amount of light being produced (S21), whereby no subsequent adjustment in the X, Z, θx and θy directions is made when the amount of light with the predetermined value is attained by adjustments in, for instance, the Y and θz directions. The reason for this is to reduce the adjustment period of time. If time permitted, the alignments may be made for all the axes while the amount of light with the power meter 7 is being observed, to determine the relative position where the light output reaches a maximum.

Further, if the amount of light measured with the power meter 7 is below the predetermined value W2 ("Yes" in S8 and S15), then the adjustment process is completed for any one of the elements being defective (S22), and if the amount of light measured using the power meter 7 is below the predetermined value W2 ("No" in S15), then the adjustment process is completed for any one of the elements being defective (S22). In this way, in situations where the amount of light does not reaches or exceeds a given value even by the adjustment of each movement axis (X, Y, Z, θx, θy or θz direction), any one of the elements can be determined to be defective before the adhesive application process (B) for applying adhesive in between the SHG element 1 and the laser device 2. For the SHG element 1 and the laser device 2 by which the amount of light is not above the given value, the determination of whichever of the optical elements is found defective can be made by determining whether or not the amount of light emitted from each optical element reaches or exceeds a certain value. If the SHG element 1 is found defective, the laser device 2 can be put again into the alignment process; if the laser device 2 is defective, the SHG element 1 can be. Consequently, when one optical element is found defective during optical axis alignment or after the alignment, the other non-defective optical element does not result in defective item, thus avoiding high-cost SHG element 1 and laser device 2 from going to waste.

Further, in the alignment process-2 (C for FIG. 6), the stationary stage 3 is caused to move to a predetermined position located above the moving stage 4, and the temperature of the moving stage 4 is changed from T1 to T3 while the temperature of the stationary stage 3 is changed from T2 to T4. After waiting until the temperatures of the respective stages stabilize at T3 and T4, the alignment process is executed by making adjustments similar to those in the flow chart shown in FIGS. 8 and 9.

The light source manufacturing apparatus according to the present invention is configured so that temperature regulation mechanisms for individually controlling their temperatures are separately provided on the respective stages that retain and fix the two optical elements for adjusting their optical axes; thus, optical axes alignment can be made at the respective optimum temperatures of the optical elements, they are temperature-dependent in wavelength conversion efficiency and the like, such as SHG element 1 and the laser device, and therefore, a highly efficient optical coupling can be achieved by way of the optical axes alignment (active alignment) with the optical elements regulated in their respective appropriate temperature where a required optical characteristic is exhibited in the optical axes alignment process by the optical elements to be aligned.

Further, even if the optical elements are adjusted in their joining process so that the amount of output light reaches its maximum amount, a high efficient light source cannot be obtained if each optical element significantly varies its characteristic depending on the temperature and if the temperatures applied to the joining process of the optical elements are different from those of the optical elements that is in operation as the light source, despite the positional adjustment of the optical elements, whereas a high efficient light source can be provided if the optical element are joined together with their temperatures being maintained at the temperature of the optical elements that is in operation as a part of the light source. In this case, if the temperature of the laser device 2 serving as part of the light source is set to the temperature where the laser device 2 emits the 1064 nm wavelength light most intensely and if the temperature of the SHG element 1 serving as part of the light source is set to the temperature where the laser device 2 most efficiently emits the second harmonic wave having one-half the wavelength of the incident light.

Further, the optical axis alignments are made before the adhesive application and the temperatures and the optical axis positions of the optical elements are readjusted or realigned after the adhesive application, with reference to the previously adjusted position, so that accurate optical axis alignment can be made even when the amount of heat transfer between the optical elements varies before and after the adhesive application. When the optical axis alignment is made by firstly applying the adhesive, the problem due to variation in the amount of thermal transfer can be solved; however, there is the possibility of causing a problem associated with the adhesive squeezing out from between the optical elements and flowing toward the surface of waveguide path, or with the adhesive hardening when time-consuming optical axis alignments are made.

Further, when a laser device is adjusted that includes the LD module 201 as a high output light source such as one for use in the projection television set, it is important that during the alignment, heat generated from the laser device be discharged and its temperature be maintained at a predetermined value. The reason is that upon energization of the laser device to emit light, the LD module self-generates heat, so that when the heat from the LD module is not discharged, the element temperature in the module rises, thereby causing a variation in a light emission characteristic. The light source manufacture apparatus according to the present embodiment enables the discharge of the heat generated by the LD module to thereby achieve an accurate adjustment, because the temperature controller 5 controls the temperature regulation mechanism 13A that has cooling capability.

While the temperature of the moving stage 4 is set to a temperature where the 1064 nm wavelength light is emitted most intensely, and the temperature of the stationary stage 3 is set to a temperature that most efficiently generates the second harmonic wave having one-half the wavelength of the incident light, the high efficient light source can also be provided if the respective temperatures are each set to a temperature where the ratio of the output of the intended light to the maximum output is 90% or more (preferably, 95% or more).

Although in the foregoing description the adjustments have been made by retaining the laser device 2 using the moving stage 4 and then by relatively moving the device 2 with respect to the SHG element 1, the adjustments may be made by retaining the laser device 2 using any movable means and then relatively moving the element 1 with respect to the device 2. Moreover, the adjustments may be made by retaining every one of the optical elements to individual movable means and then moving both optical elements.

In FIG. 1, because of the SHG element 1 being disposed on the upper portion of the laser device 2, the power meter 7 is placed above the laser device 2, to measure the amount of light; however, the optical axis of the laser device 2 may be laterally oriented, not upwardly.

In addition, while the SHG element 1 is used as the wavelength conversion element in the foregoing description; however, the invention is not limited to the element that generates the second harmonic wave, and may be an element that generates the third or fourth harmonic wave.

In the foregoing description, while the temperature of the laser device 2 is set to, for instance, 40 degrees C. and that of the SHG element 1 to, e.g., 70 degrees C., the temperature may be set according to the properties of the respective optical elements because an element temperature that maximizes the output differs according to the property of the optical element. Actually, in the original design phase, it is known at what temperature level in degree C. the optical element produces its maximum output; therefore, an actually set temperature may be determined by pre-examining a temperature vs. output relationship mainly in the neighborhood of the known temperature. While the present invention has been shown and described with reference to preferred embodiments thereof, it will be understood by those skilled in the art that various modifications and the like could be made thereto without departing from the spirit and scope of the invention.

What is claimed is:

1. An apparatus for manufacturing a light source, comprising:

a first retainer that retains a laser device;

a second retainer that retains a wavelength conversion element that receives a light emitted from the laser device and emits the received light with a wavelength of the received converted light into another wavelength;

a first temperature maintainer that maintains the laser device at a temperature where an output of light to be emitted from the laser device is equal to or greater than a predetermined rate of its maximum output;

a second temperature maintainer that maintains the wavelength conversion element at a temperature where an output of light to be emitted from the laser device is equal to or greater than a predetermined rate of its maximum output;

an amount-of-light detector that measures an amount of light emitted from the wavelength conversion element whose temperature is maintained by the second temperature maintainer, and a position controller that causes the first retainer to move relative to the second retainer and/or causes second retainer to move relative to the first retainer, so that the amount of light measured by the amount-of-light detector reaches or exceeds a predetermined value, and then to join them together, wherein the laser device maintained at the first temperature and the wavelength conversion element maintained at the second temperature are to be joined together so that the amount of light measured by the amount-of-light detector is equal to or greater than a predetermined value.

2. The apparatus for manufacturing a light source of claim 1, wherein the first temperature at which the laser device is maintained corresponds to an operating temperature of the laser device as a part of the light source, and the second temperature at which the wavelength conversion element is maintained corresponds to an operating temperature of the wavelength changing device as a part of the light source.

3. The apparatus for manufacturing a light source of claim 2, further comprising:

a joining substance applicator that places between the laser device and the wavelength conversion element a joining substance for joining them together, wherein before and after placing the joining substance between the laser device and the wavelength conversion element by the joining substance applicator, the position controller moves the laser device and the wavelength conversion element in a way such that the laser device and the wavelength conversion element move to a relative position where an amount of light measured by the amount-of-light detector is equal to or greater than the predetermined value, and the first and the second retainers retain the laser device and the wavelength conversion element until the laser device and the wavelength conversion element are joined together by the joining substance.

4. The apparatus for manufacturing a light source of claim 3, wherein the first temperature maintainer includes a first temperature conditioner that measures a temperature of the first retainer and heats and/or cools the first retainer, and a first temperature controller that controls the first temperature conditioner so that the temperature of the first retainer becomes a first target temperature determined in advance in order to maximize the output of the light to be emitted from the laser device, and wherein the second temperature maintainer includes a second temperature conditioner that measures a temperature of the second retainer and heats and/or cools the second retainer, and a second temperature controller that controls the second temperature conditioner so that the temperature of the second retainer becomes a second target temperature determined in advance in order to maximize the output of the light to be emitted from the wavelength conversion element, and wherein the values of the first target temperature and the second target temperatures before the joining substance is placed between the laser device and the wavelength conversion element are different from those after the joining substance is placed therebetween, respectively.

5. The apparatus for manufacturing a light source of claim 1, further comprising:

a joining substance applicator that places between the laser device and the wavelength conversion element a joining substance for joining them together, wherein before and after placing the joining substance between the laser device and the wavelength conversion element by the joining substance applicator, the position controller moves the laser device and the wavelength conversion element in a way such that the laser device and the wavelength conversion element move to a relative position where an amount of light measured by the amount-of-light detector is equal to or greater than the predetermined value, and the first and the second retainers retain the laser device and the wavelength conversion element until the laser device and the wavelength conversion element are joined together by the joining substance.

6. The apparatus for manufacturing a light source of claim 5, wherein the first temperature maintainer includes a first temperature conditioner that measures a temperature of the first retainer and heats and/or cools the first retainer, and a first temperature controller that controls the first temperature conditioner so that the temperature of the first retainer becomes a first target temperature determined in advance in order to maximize the output of the light to be emitted from the laser device, and wherein the second temperature maintainer includes a second temperature conditioner that measures a temperature of the second retainer and heats and/or cools the second retainer, and a second temperature controller that controls the second temperature conditioner so that the temperature of the second retainer becomes a second target temperature determined in advance in order to maximize the output of the light to be emitted from the wavelength conversion element, and wherein the values of the first target temperature and the second target temperatures before the joining substance is placed between the laser device and the wavelength conversion element are different from those after the joining substance is placed therebetween, respectively.

* * * * *